(12) United States Patent
Nassif et al.

(10) Patent No.: US 6,877,142 B2
(45) Date of Patent: *Apr. 5, 2005

(54) TIMING VERIFIER FOR MOS DEVICES AND RELATED METHOD

(75) Inventors: Nevine Nassif, Arlington, MA (US); Madhav Desai, Mumbai (IN); James Arthur Farrell, Harvard, MA (US); Harry Ray Fair, III, Newburyport, MA (US); Roy Badeau, Berlin, MA (US); Nicholas Lee Rethman, North Andover, MA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 205 days.

This patent is subject to a terminal disclaimer.

(21) Appl. No.: 10/218,079

(22) Filed: Aug. 13, 2002

(65) Prior Publication Data

US 2003/0149951 A1 Aug. 7, 2003

Related U.S. Application Data

(63) Continuation of application No. 09/208,780, filed on Dec. 10, 1998, now Pat. No. 6,473,888, which is a continuation of application No. 09/085,265, filed on May 26, 1998, now abandoned.

(51) Int. Cl.[7] .............................................. G06F 17/50
(52) U.S. Cl. ...................................... 716/6; 716/4; 716/5
(58) Field of Search ..................................... 716/6, 5, 4

(56) References Cited

U.S. PATENT DOCUMENTS

| | | | | | |
|---|---|---|---|---|---|
| 4,924,430 | A | * | 5/1990 | Zasio et al. ..................... | 716/6 |
| 5,452,225 | A | * | 9/1995 | Hammer ....................... | 703/19 |
| 5,548,526 | A | * | 8/1996 | Misheloff ..................... | 703/15 |
| 5,559,715 | A | * | 9/1996 | Misheloff ..................... | 703/19 |
| 5,748,489 | A | * | 5/1998 | Beatty et al. .................. | 716/7 |
| 6,473,888 | B1 | * | 10/2002 | Nassif et al. .................. | 716/6 |

* cited by examiner

*Primary Examiner*—Vuthe Siek

(57) ABSTRACT

The present invention relates to a method and apparatus for determining capacitances and charge models for MOS devices to be used in calculating delays in a timing verifier for a circuit. The models are generated by first creating a variety of configurations of MOS devices which vary the inputs to the source, drain, and gate. Such inputs may include rising and falling values as well as constant values at VDD and VSS. Simulations are run on all of the configurations using conditions anticipated for the circuit to be analyzed. Capacitance values obtained from the simulations are used to determine models based upon length and width of the MOS devices using standard curve fitting techniques. Models then can be used for determining delays within the circuit.

18 Claims, 12 Drawing Sheets

TIMING VERIFIER FOR MOS DEVICES AND RELATED METHOD

CROSS-REFERENCE TO RELATED APPLICATIONS

The present application is a continuation of commonly assigned U.S. patent application Ser. No. 09/208,780, which was filed on Dec. 10, 1998, by James A. Farrell, et al. for a TIMING VERIFIER FOR MOS DEVICES AND RELATED METHOD, which is now allowed now U.S. Pat. No. 6,473,888, which was a Continuation of U.S. patent application Ser. No. 09/085,265, filed May 26, 1998, now abandoned, and these are hereby incorporated by reference.

BACKGROUND OF THE INVENTION

1. Field of the Invention

The present invention relates to timing verification tools used for analyzing circuit designs. In particular, it relates to a tool for determining accurate, analytic expressions for the capacitance and charge of MOS devices in a circuit.

2. Background Information

Circuit verification is a significant part of analyzing a design of a circuit. It is significantly more economical to ensure that the circuit will operate as intended prior to production. Timing verification is a portion of the circuit verification process. Timing verification is used to identify all critical and race paths through a circuit. Critical paths are paths through which a signal passes more slowly than other paths. In race paths, the signals pass more quickly. Timing verification has become increasingly more important for the design of CMOS circuits. As CMOS circuits on a chip have become more complex, the complexity for verifying timing has also increased. Also, as chips are designed to operate, at higher speeds, timing verification must be more accurate. Thus, accurate timing verification of complex structures is a principal part of the design process for circuits.

A variety of tools are available for timing verification. These tools have different speeds for verification and different accuracy of the results. The most significant concern for a circuit designer is that a functional violation will go undetected during timing verification, i.e. that an error will not be found during the verification process. If a violation is missed by the timing verifier, the circuit will pass to the silicon where errors become more difficult and more costly to uncover and resolve.

One type of timing verification tool is computerized circuit simulators, such as SPICE. With SPICE, the circuit is modeled within the computer. The program simulates operation of an entire circuit which is represented as a set of connected elements. Certain assumptions are made regarding the inputs. The program then determines the value of signals at all of the points within the circuit at spaced time intervals. While SPICE and other circuit simulators provide very accurate timing information on a circuit, they are also extremely slow. They operate with small time segments and make many calculations for each time segment to determine the signal values at each of the many nodes in a circuit. This slow speed inhibits their application as useful timing verification tools for an entire circuit. Therefore, other timing verification tools have been created which use simpler models of a circuit. These other tools provide much faster speeds with a loss of accuracy. Since accuracy decreases with such tools, a circuit designer will often use the simpler, quicker tools just to determine potential critical or race paths, or paths which may induce a functional violation. Once certain paths are identified, they will be checked more accurately using SPICE or a similar circuit simulator, to determine whether any changes need to be made to the circuit.

With a timing verification tool, it is most important not to miss any violations. A missed violation will result in an erroneous circuit, which may not be detected until much later. However the number of false violations should also be minimized. As the number of detected violations increases, the time to accurately check each detected violation also increases. With many false violations being reported by the timing verifier, the time for checking the circuit becomes needlessly large. Therefore, a need exists for a timing verification tool which quickly and accurately estimates minimum and maximum delay times, while erring on the pessimistic side in order to insure that no violations are missed.

Traditionally, the delays through MOSFETs have been calculated by treating them as a resistance-capacitance (RC) structure. By using a model of the corresponding RC structure for a MOS device, the Miller capacitance can be used to determine the maximum and minimum values for delays. The Miller capacitance is used because it is easy to calculate and represents a worst case scenario. However, the difference between delays using such models differs significantly from actuality. Such inaccuracies result in large numbers of false violations which need to be checked. Therefore, a need exists for a timing verification tool which more accurately reflects delays and capacitances within the circuit.

SUMMARY OF THE INVENTION

The present invention overcomes many of the deficiencies with the prior art by providing a timing verification tool which more accurately models capacitances or charges in MOSFET devices. The present invention includes a computer-based system for generating timing models and charge models for each node in the circuit. The models are used to estimate delays within the circuit. To create capacitance models, the system represents a set of MOSFETs within certain defined structures. The system then runs simulations using SPICE or a similar circuit simulator, to determine data points for capacitances or charges at specific locations within the structures. The set of data generated in the simulations is then used to determine charge models for each point in the various structures using curve fitting techniques. The charge models represent the charge based upon the width and length of the MOSFET under the operating conditions for the circuit. The models can then be used in a timing verifier for calculating capacitance or charge in determining delays.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
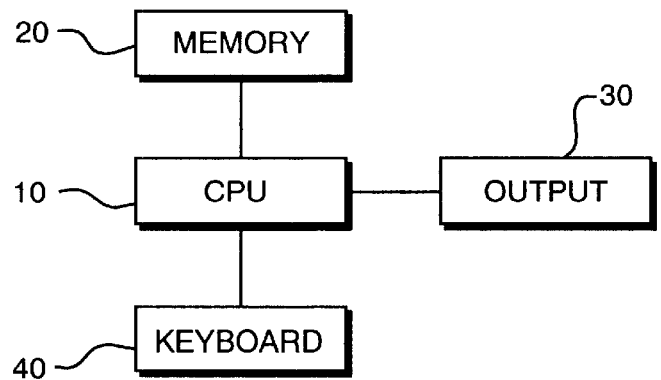
FIG. 1 illustrates computer hardware for implementing the present invention.

FIG. 1 represents hardware which can be used to implement the present invention. The hardware corresponds to the elements of a general purpose computer. Of course, these elements could be replaced with a special purpose computer or equivalent hardware and software elements for carrying out the processes of the present invention as discussed below. As illustrated in FIG. 1, the hardware can include a central processing unit (CPU) 10 which executes digital instructions. Instructions are stored and retrieved from a memory 20 connected to the CPU 10. In addition to instructions, the memory 20 stores data used and processed by the CPU 10 in executing the instructions. A keyboard 40 is connected to the CPU 10 in order to input data or other information which can be stored in the memory 20 or used by the CPU 10. This system includes an output 30 also connected to the CPU 10. The output 30 can be of a variety of types depending upon the subsequent processing necessary for the output. For example, the output can include a display, a printer, a disk drive, or other elements for outputting magnetic or electronic information.

Figure 2:
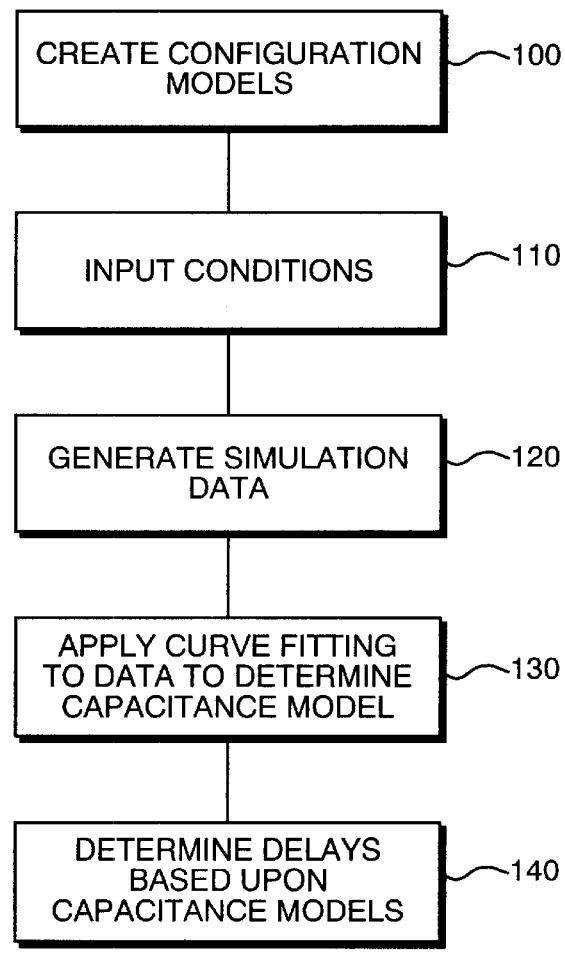
FIG. 2 is a flow diagram representing operation of an embodiment of the present invention.

FIG. 2 illustrates the principal steps performed by the CPU 10 according to an embodiment of the present invention. In step 100, models of configurations of CMOS devices are created and stored in the memory 20. The manner in which these models are created and stored depends on how they will be subsequently processed. As discussed below, the models may be processed using a common circuit simulation program known as SPICE. SPICE defines requirements for creating and inputting models of circuits. These requirements are known to those who work in the area for circuit design. The different models or configurations are used to represent different conditions at the source, drain, and gate of an NMOS or PMOS device. The objective of the present invention is to determine capacitances or charges as seen at the gate, source or drain of the MOS devices. These capacitances or charges depend upon the voltage conditions on all three terminals of the device. Therefore, the circuit models selected should represent all or a variety of the possible conditions. As discussed further below FIGS. 4–15 illustrate a set of configurations which can be modeled to represent the conditions on the terminals of a MOS device. Tables 1–6 identify the conditions represented in the figures. The configuration models can be used to determine charge models for a large variety of chips or circuit configurations without needing to be recreated or reentered.

In step 110, initial conditions for operation of the chip are identified. These conditions determine parameters under which the chip operates which affect the calculated capacitances. For example, the specific processes on the chip, the VDD and the VSS values, the voltage threshold (V) for the process, and the temperature for the process all effect the charge values and need to be preset. The values selected as initial conditions also include parameters for simulation of chip activity, such as the simulation time, the step sizes, and input voltage waveforms. Since, according to one embodiment as discussed below, the models will be based on the width and length of the MOS devices, minimum, maximum and step sizes in both width and length may be entered as initial conditions for the simulation.

Figure 3:
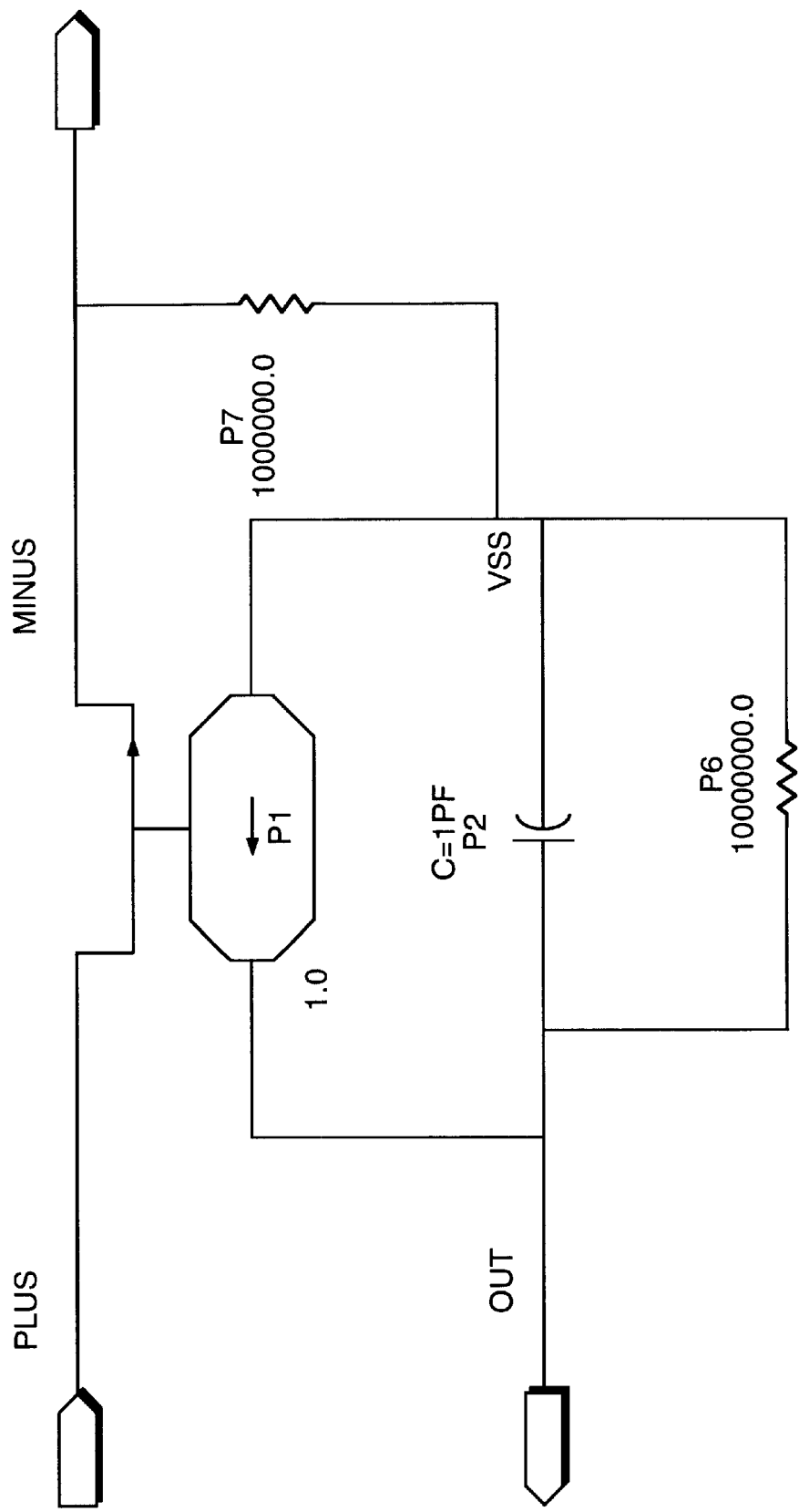
FIG. 3 illustrates a model of a circuit structure for determining charges in simulations.

At step 120, a simulation is run and data is generated. Using a circuit simulation program, such as SPICE, a simulation is run on all of the MOS device configurations for a specified time period and with the varying voltage changing at the specified rate. During the simulation, the charge on each of the reference nodes is determined. FIG. 3 illustrates one manner for determining the charges. The circuit illustrated in FIG. 3 is placed at the node for which the charge is being determined. For example, in FIGS. 4–9 which are used to determine charges at the gate of each device, the circuit of FIG. 3 could be positioned between the input and gate of each structure. A similar circuit could be placed on a source or drain of a device to determine charges at those locations. Other procedures could also be used for determining charges during the simulation. For example, to determine channel charges, a very small resistor could be placed upon the source and drain of the MOS device. The current in the resistors are determined and integrated to determine a charge on the drain and source. The difference represents the charge in the channel.

Of course, since the circuit is only being modeled, the simulation includes a model of the output circuit element, such as that illustrated in FIG. 3. The OUT value at the end of each run of the simulation represents the capacitance value for the conditions in the simulation. The simulations are run many times with a variety of widths (w) and lengths (I) for each of the MOS devices, each having an output value (OUT). The OUT value, or similar representation of the charge, for every structure in each iteration is stored in the memory 20 for later processing.

In step 130, capacitance models are calculated from the data generated in step 120. The data from each configuration is analyzed using curve fitting techniques which determine the capacitance value in terms of the width (w) and length (1) of the model device. Any type of known curve fitting technique may be used for generating equations to represent the capacitance models. However, when maximum capacitance is being calculated, the fitted curve should exceed all of the data points from the simulation. On the other hand, when a minimum capacitance value is being determined, the curve should be fitted to be less than all of the data points from the simulation. This causes any errors in the estimation of capacitances to be in a single direction which avoids missing potential timing violations during verification. The curve fitting techniques are used to generate a charge model for each configuration in the configuration models. Once the charge models have been determined, they can be used in calculating delays for the actual circuit on the chip, step 140. Each device on the chip will be represented by a specific model based upon its width, length, and configuration as compared to other devices in the circuit. The models can be used to accurately determine capacitances and charges which are used in determining delays and in timing verification.

In the process of the present invention, models for charges of MOS devices are determined based upon defined configurations. Configurations should be selected which correspond to portions of the circuit which is to be verified. FIGS. 4–15 represent possible configurations for determining charges. The configurations in FIGS. 4–15 are representative of a wide variety of configurations found in circuits. Furthermore, the capacitances and charges corresponding to these configurations are easily combinable to determine attributes of more complex structures. Each of the illustrated configurations includes a set of MOS devices in which each of the terminals (gate, source, and drain) of each MOS device is connected to one of: a rising voltage input, a falling voltage input, VSS, VDD, or the source or drain of another MOS device. The charges are then determined for particular MOS devices. Tables 1–5 represent the models created using the present invention for various MOS devices in FIGS. 4–15. Of course, these models are dependent upon the conditions utilized during the simulation, such as the particular process used, the VDD value, and the temperature. The initial conditions used in the simulations should be similar to the expected conditions of the chip being designed. The tables identify the relevant structures corresponding to each of the illustrated configurations and examples of a model for the relevant devices.

Figure 4:
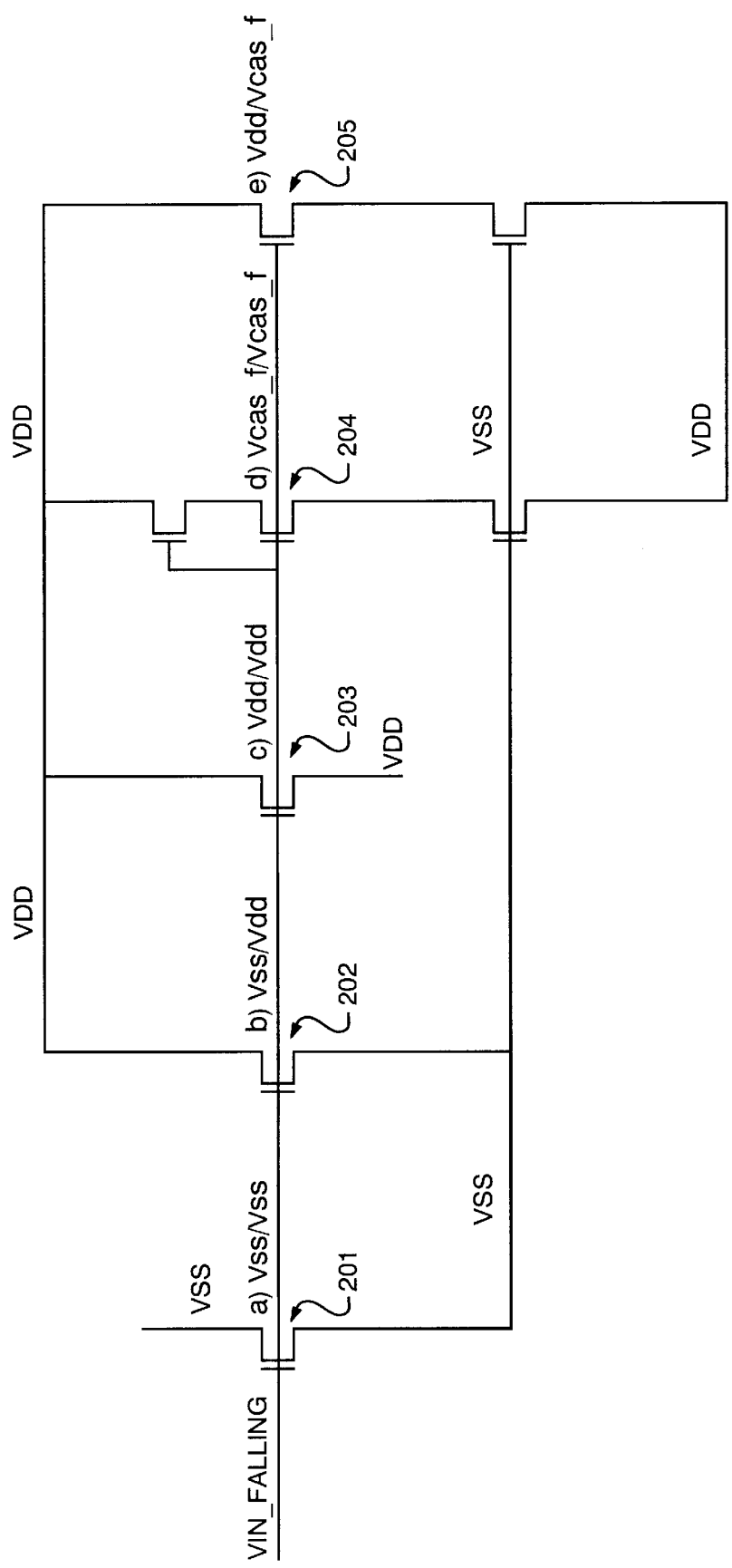
FIGS. 4–15 represent circuit configurations, which can be modeled during operation of the present invention.
Figure 5:
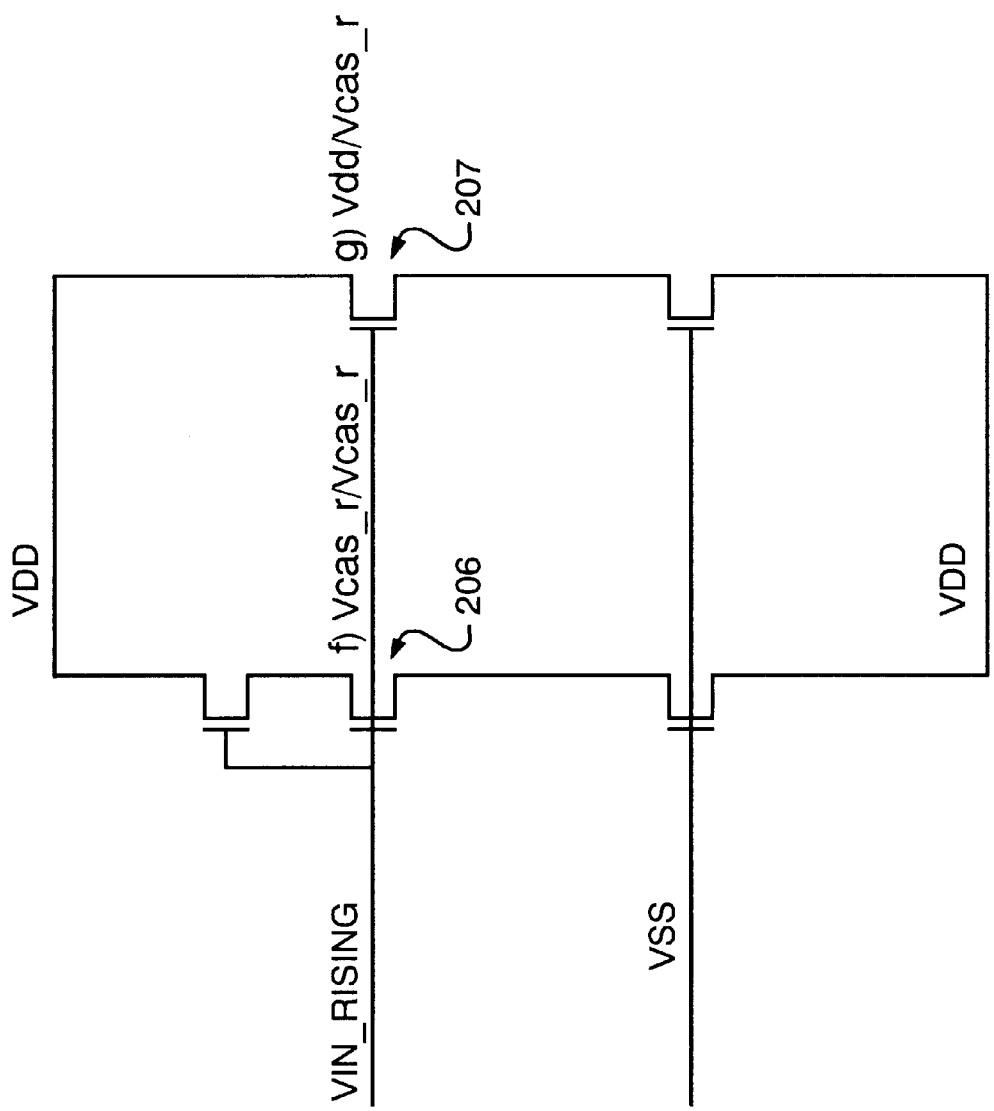
Figure 6:
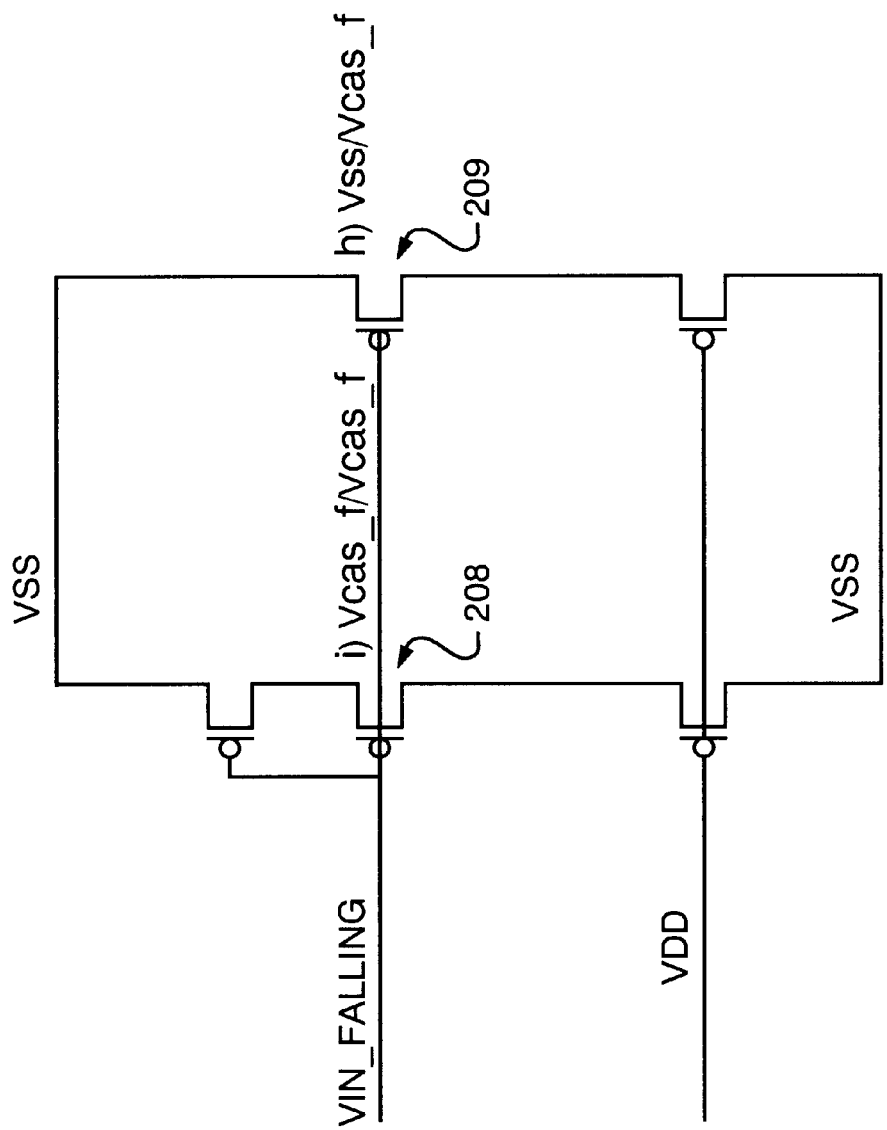
Figure 7:
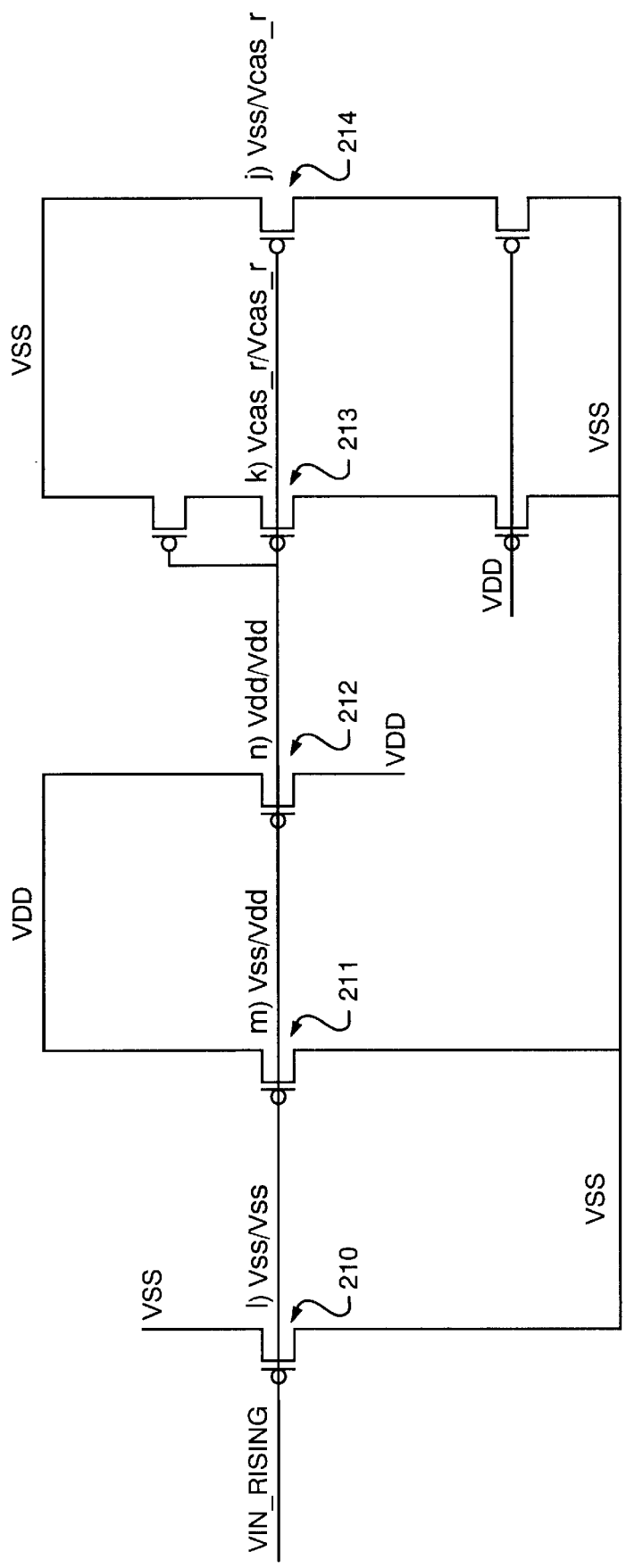

FIGS. 4–7 are used to determine minimum charges as seen at the gate within certain configurations. FIGS. 4 and 5 relate to NMOS devices and FIGS. 6 and 7 relate to PMOS, devices. Certain MOS devices within the structures are identified by reference numerals 201–214. Table 1 represents relationships between the voltage values on each terminal or an indicated device reference number. In addition to sources and drains at VSS or VDD, the structures are created to show rising or falling voltage on a source or drain. Furthermore, in order to accommodate more complex circuits, the structures illustrated in FIGS. 4–7 include terminals attached to rising (vcasr) or falling (vcasf) outputs of cascode structures. Of course, other structures and devices may be relevant to different circuits. In such a situation, those structures would be included in the simulation and model creation processes. The models set forth in Table 1 are only representative of the form for charge models. They are also only applicable to the specific processes, voltages, and temperatures which were used in the simulations. For other circuits, the present invention determines simulation data using relevant conditions, as discussed above, and corresponding models are created. Table 1, and the following tables, also identify for the particular conditions and models listed in the table, the maximum error between the model and the data generated by SPICE during the simulations step.

TABLE 1

MINIMUM CAPACITANCES AT GATES

| Device Number | Voltage at source/drain or drain/source | Voltage at gate | Model | Maximum error from SPICE data |
|---|---|---|---|---|
| NMOS DEVICES | | | | |
| 201 | vss/vss | rising/falling | $.120*l*w + .118*w + .064*l + .034$ | 0.71% |
| 202 | vss/vdd | rising/falling | $.087*l*w + .106*w + .059*l + .040$ | 1.22% |
| 203 | vdd/vdd | rising/falling | $0.21*l*w + .080*w + .058*l + .023$ | 5.36% |
| 204 | vcasf/vcasf | falling | $0.16*l*w + .030w + .078*l$ | 5.32% |
| 205 | vdd/vcasf | falling | $0.19*l*w + .067*w + .068*l + .036$ | 3.67% |
| 206 | vcasr/vcasr | rising | $.018*l*w + .002*2w + .068*l$ | 16.98% |
| 207 | vdd/vcasr | rising | $.021*l*w + .055*w + .071*l + .011$ | 2.86% |
| PMOS DEVICES | | | | |
| 208 | vcasf/vcasf | falling | $0.25*w*l + .005*w + .055*l$ | 12.20% |
| 209 | vss/vcasf | falling | $0.26*w*l + .080*w + .064*l + .014$ | 3.07% |
| 210 | vss/vss | rising/falling | $.026*w*l + .114*w + .050*l + .026$ | 5.38% |
| 211 | vss/vdd | rising/falling | $.081*w*l + .124*w + .064*l + .024$ | 1.20% |
| 212 | vdd/vdd | rising/falling | $.112*w*l + .132*w + .068*l + .034$ | 0.64% |
| 213 | vcasr/vcasr | rising | $.020*w*l + .029* + .072*l + .012$ | 6.69% |
| 214 | vss/vcasr | rising | $.024*w*l + .091*w + .073*l + .008$ | 1.94% |

Figure 8:
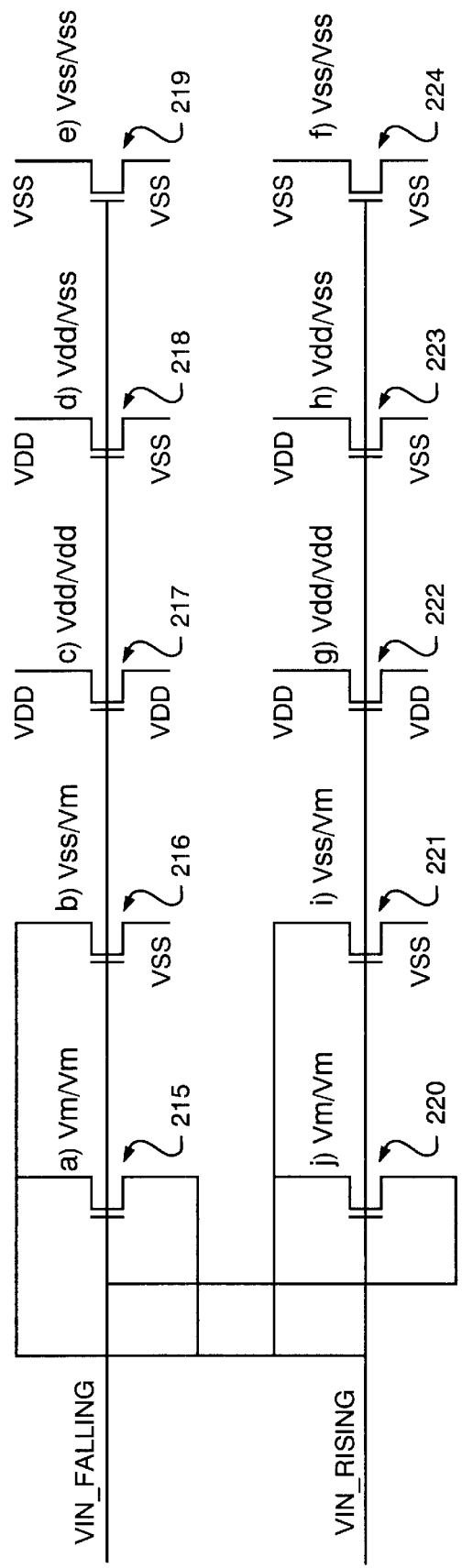
Figure 9:
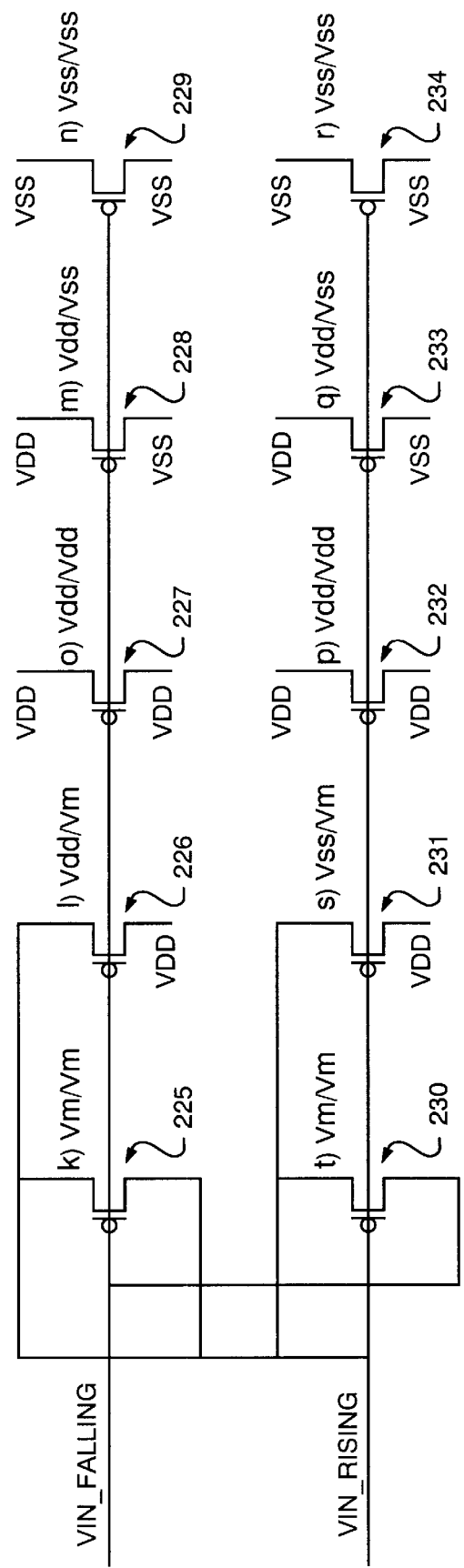

FIGS. 8 and 9 show configurations model to determine the maximum charge as seen at the gate. Table 2 identifies the voltages applied to the gate, source and drain for these configurations. The configurations shown in FIGS. 8 and 9 and in Table 2 include a source and/or drain connected to a Miller effect voltage. A Miller effect is caused when the drain and source are moving in a direction opposite to the gate. If the gate is rising, the source and drain are falling; and if the gate is falling, the source and drain are rising. The voltage Vm in Table 2 represents a voltage necessary to cause a Miller effect. FIG. 8 MOS devices and FIG. 9 to PMOS devices.

TABLE 2

MAXIMUM CAPACITANCES AT GATES

| Device Number | Voltage at source/drain or drain/source | Voltage at gate | Model | Maximum error from SPICE data |
|---|---|---|---|---|
| NMOS DEVICES | | | | |
| 215 | vm/vm | falling | .124*w*l + .220*w .053*l + .033 | 1.70% |
| 216 | vss/vm | falling | .123*w*l + .170*w + .058*l + .028 | 1.22% |
| 217 | vdd/vdd | falling | .023*w*l + .084W + .056*l + .025 | 8.00% |
| 218 | vdd/vss | falling | .089*w*l + .107*w + .059*l + .030 | 1.74% |
| 219 | vss.vss | falling | .121*w*l + .119*w + .064*l + .035 | 0.72% |
| 220 | vm/vm | rising | .120*w*l + .224*w + .066*l + .031 | 0.33% |
| 221 | vss/vm | rising | .121*w*l + .172*w + .071*l + .015 | 0.63% |
| 222 | vdd/vdd | rising | .021*w*l + .085*w + .071*l + .029 | 1.29% |
| 223 | vdd/vss | rising | .089*w*l + .112*w + .068*l | 3.22% |
| 224 | vss/vss | rising | .133*w*l + .108*w + .055 | 8.62% |
| PMOS DEVICES | | | | |
| 225 | vm/vm | falling | .112*w*l + .281*w + .070*l + .026 | 0.30% |
| 226 | vdd/vm | falling | .112*w*l _ .208*w + .075*l + .009 | 0.51% |
| 227 | vdd/vdd | falling | .125*w*l + .121*w + .005*l + .054 | 8.71% |
| 228 | vdd/vss | falling | .083*w*l + .127*w + .074*l + .020 | 2.68% |
| 229 | vss/vss | falling | .026*w*l + .122*w + .065*l + .028 | 1.03% |
| 230 | vm/vm | rising | .115*w*l + .277*w + .058*l + .033 | 1.57% |
| 231 | vdd/vm | rising | .114*w*l + .206*w + .063*l + .027 | 1.19% |
| 232 | vdd/vdd | rising | .113*w*l + .133*w + .069*l + .035 | 0.64% |
| 233 | vdd/vss | rising | .083*w*l + .126*w + .063*l + .022 | 1.65% |
| 234 | vss/vss | rising | .029*w*l + .120*w + .045*l + .027 | 8.08% |

Figure 10:
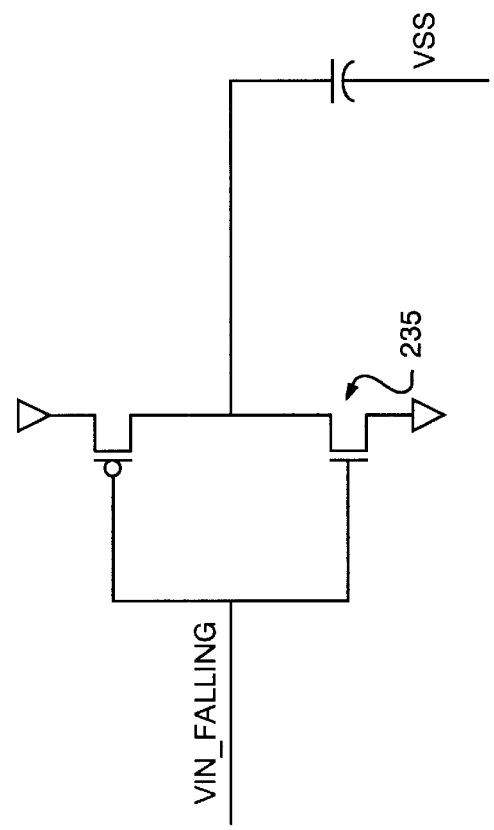
Figure 11:
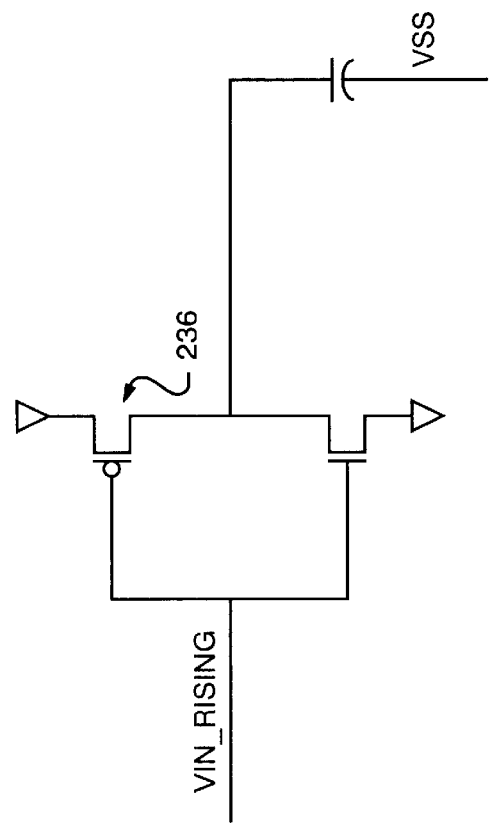

The preceding configurations were used to determine charges at the gate when the gate input is rising or falling. FIGS. 10–15 illustrate configurations for determining charge in a channel of a device which is on, off, turning on, or turning off. FIGS. 10 and 11 represent the charge seen at the drain of a device turning off for an NMOS and a PMOS device, respectively. The models are set forth in Table 3. For these injected charge calculations, the model equations are functions of devices width, input transition time ($t\_r_{in}$, and output transition time ($t\_r_{out}$. Therefore, the simulation must include data with such information.

Figure 12:
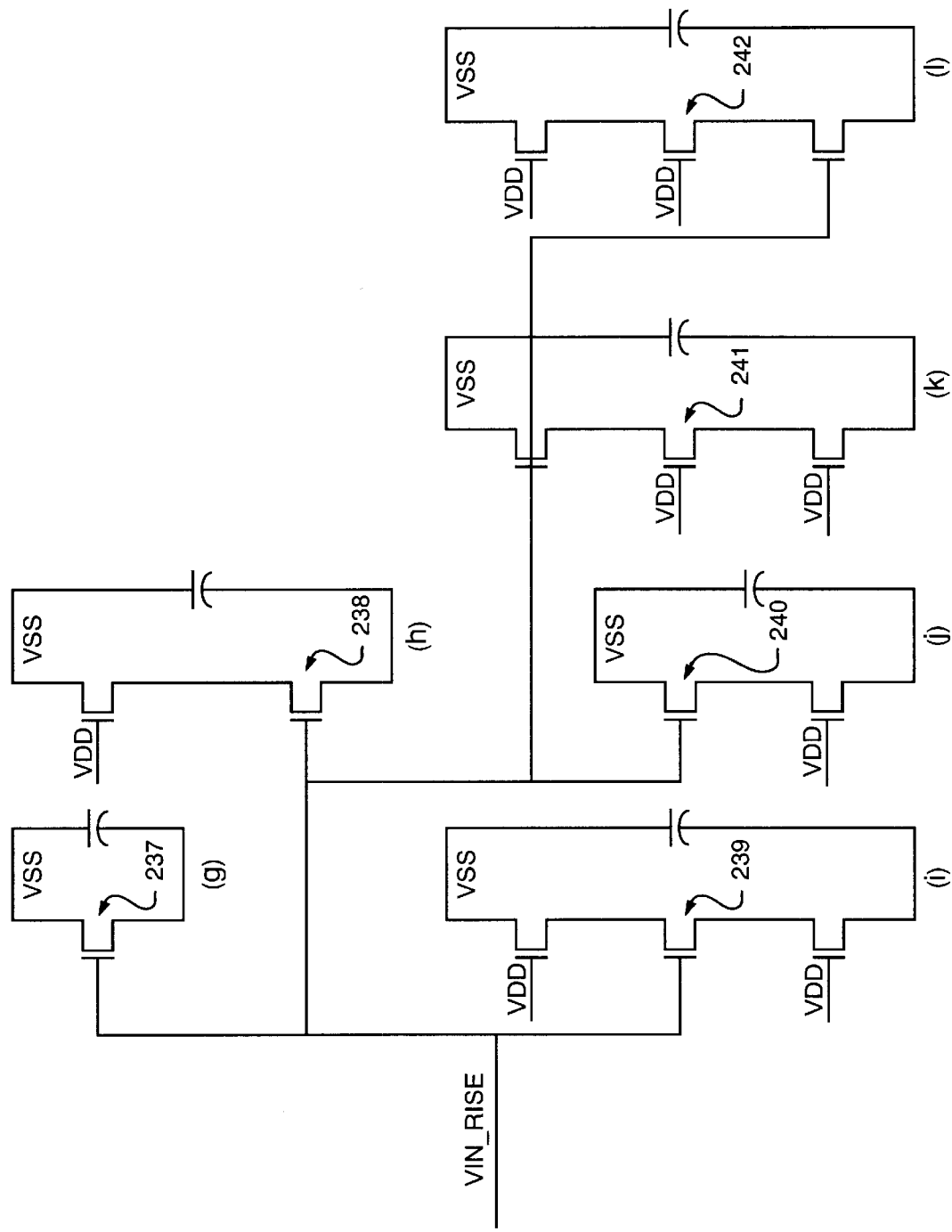
Figure 13:
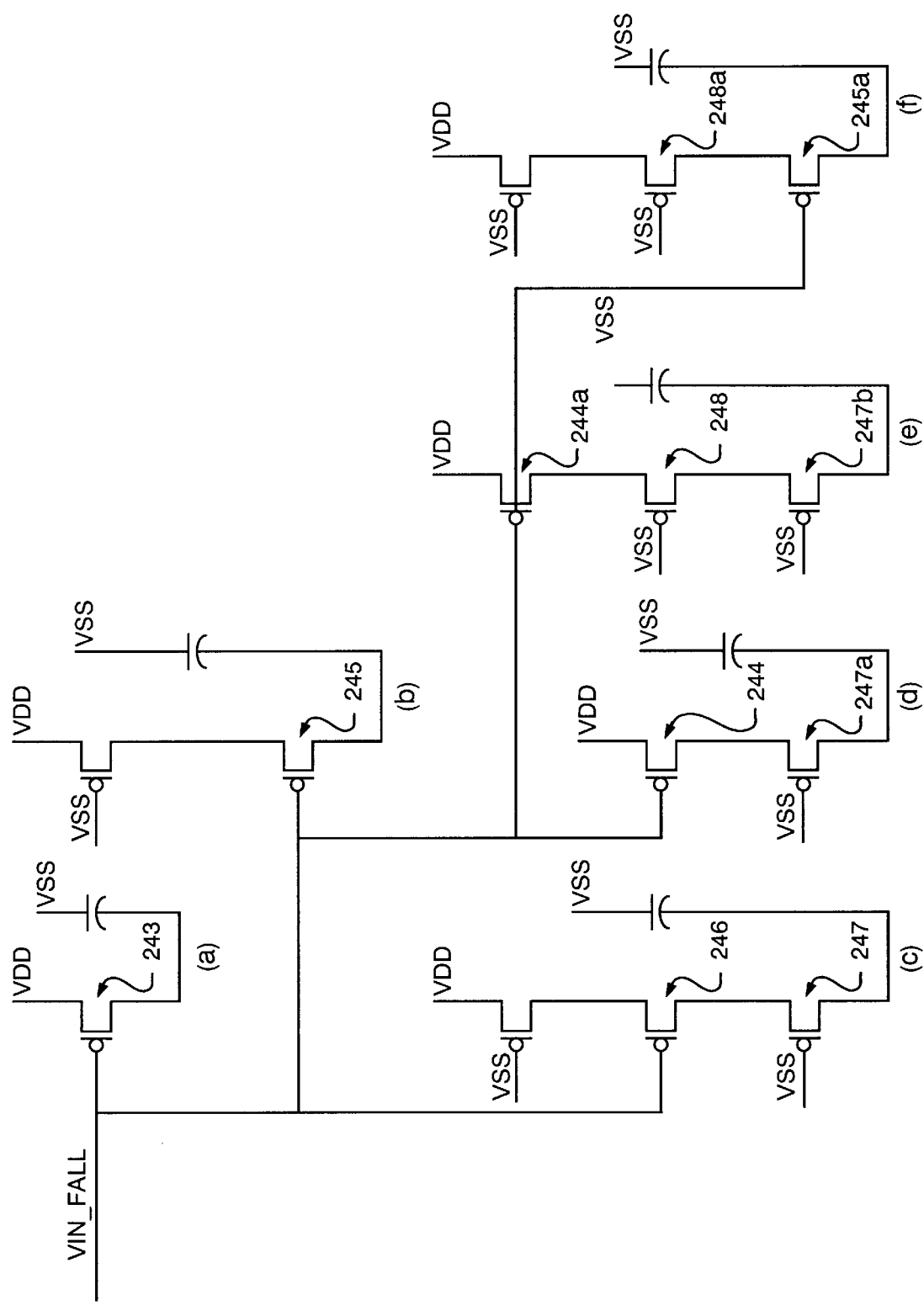

FIGS. 12 and 13 represent the charge that is at the drain of a device which is on or turning on for NMOS and PMOS devices, respectively. These models are set forth in Tables 4 and 5. Table 4 represents maximum charges. The models are determined by curve fitting so that all of the simulation data is exceeded. Table 5 represents the minimum charges and is determined from the same data as Table 4. However, the models for this case are determined by curve fitting so that all of the simulation data exceeds the model.

TABLE 3

MAXIMUM CHARGE AT DRAIN (TURNING OFF)

| Device Number | Voltage at source/drain or drain/source | Voltage at gate | Model | Maximum error from SPICE data |
|---|---|---|---|---|
| NMOS DEVICE: | | | | |
| 235 | — | gate falling | $w * (1.142 * t\_r_{in}^2 * t\_r_{out}^{-0.8} + 0.301 - 0.117 * t\_r_{out}^{-0.2} - 0.041 * t\_r_{in} * t\_r_{out}^{-0.4})$ | 6.38% |
| PMOS DEVICE: | | | | |
| 236 | — | gate rising | $w * (0.491 * t\_r_{in}^2 * t\_r_{out}^{-0.8} + 0.264 - 0.044 * t\_r_{out}^{-0.2} - 0.097 * t\_r_{in} * t\_r_{out}^{-0.4})$ | |

TABLE 4

MAXIMUM CHARGE AT DRAIN (ON OR TURNING ON)

| Device Number | Source connected to | Drain connected to | Voltage at gate | Model | Maximum error from SPICE data |
|---|---|---|---|---|---|
| NMOS DEVICES | | | | | |
| 237 | vss | at least one PMOS device | rising | $0.213*w*l + 0.322*w$ | 9.80% |
| 238 238a | vss | only NMOS | rising | $0.213*w*l + 0.304*w$ | 9.32% |
| 239 | not vss | only NMOS | rising | $0.207*w*l + 0.314*w$ | 5.47% |
| 240 240a | not vss | at least one PMOS device | rising | $0.210*w*l + 0.321*w$ | 5.43% |
| 241 241a 241b | not vss | at least one PMOS device | high | $0.216*w*l + 0.209*w$ | 7.44% |
| 242 242a | not vss | only NMOS | high | $0.209*w*l + 0.205*w + 0.01*l + 0.012$ | 5.75% |
| PMOS DEVICES: | | | | | |
| 243 | vdd | at least one NMOS device | falling | $0.192*w*l + 0.385*w + 0.017*l$ | 9.44% |
| 244 244a | vdd | only PMOS | falling | $0.189*w*l + 0.379*w + 0.002*l$ | 13.57% |
| 245 245a | not vdd | at least one NMOS device | falling | $0.192*w*l + .383*w$ | 6.13% |
| 246 | not vdd | only PMOS | falling | $0.193*w*l + 0.369*w + 0.006*l$ | 5.69% |
| 247 247a 247b | not vdd | at least one NMOS device | low | $0.190*w*l + 0.242*w + 0.029$ | 8.65% |
| 248 248a | not vdd | only PMOS | low | $0.194*w*l + 0.216*w + 0.003*l + 0.087$ | |

TABLE 5

MINIMUM CHARGE AT DRAIN (ON OR TURNING ON)

| Device Number | Source connected to | Drain connected to | Voltage at gate | Model | Maximum error from SPICE data |
|---|---|---|---|---|---|
| NMOS DEVICES: | | | | | |
| 237 | vss | at least one PMOS device | rising | $0.199*w*l + 0.304*w$ | 5.15% |
| 238 238a | vss | only NMOS | rising | $0.195*w*l + 0.278*w$ | 8.52% |
| 239 | not vss | only NMOS | rising | $0.197*w*l + 0.298*w$ | 5.18% |
| 240 240a | not vss | at least one PMOS device | rising | $0.199*w*l + 0.304*w$ | 5.15% |
| 241 241a 241b | not vss | at least one PMOS device | high | $0.201*w*l + 0.194*w$ | 6.92% |
| 242 242a | not vss | only NMOS | high | $0.198*w*l + 0.194*w + 0.014*l + 0.012$ | 5.44% |
| PMOS DEVICES: | | | | | |
| 243 | vdd | at least one NMOS device | falling | $0.175*w*l + 0.352*w + 0.015*l$ | 8.63% |
| 244 244a | vdd | only PMOS | falling | $0.168*w*l + 0.331*w$ | 11.95% |
| 245 245a | not vdd | at least one NMOS device | falling | $0.180*w*l + 0.362*w$ | 5.78% |
| 246 | not vdd | only PMOS | falling | $0.181*w*l + 0.353*w + 0.006*l$ | 5.38% |
| 247 247a | not vdd | at least one NMOS | low | $0.175*w*l + 0.223*w + 0.026$ | 7.96% |

TABLE 5-continued

MINIMUM CHARGE AT DRAIN (ON OR TURNING ON)

| Device Number | Source connected to | Drain connected to | Voltage at gate | Model | Maximum error from SPICE data |
|---|---|---|---|---|---|
| 247b 248 248a | not vdd | device only PMOS | low | 0.177*w*1 + 0.215*w + 0.022*1 + 0.016 | 6.59% |

Figure 15:
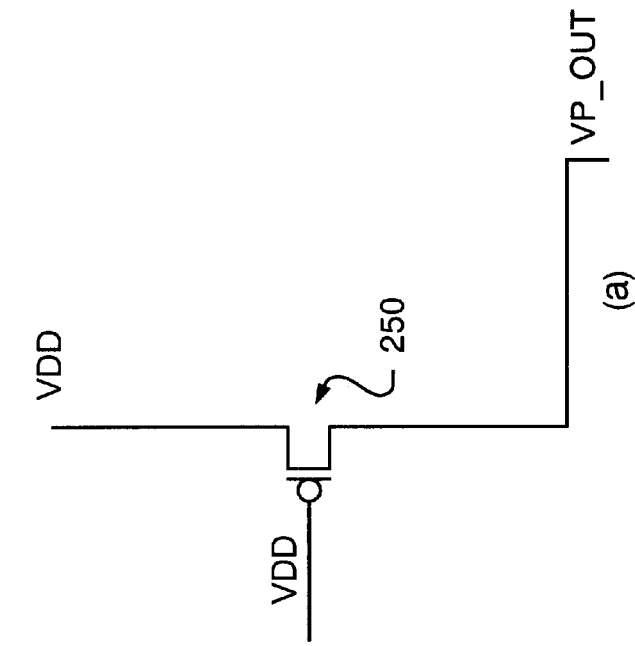
Figure 14:
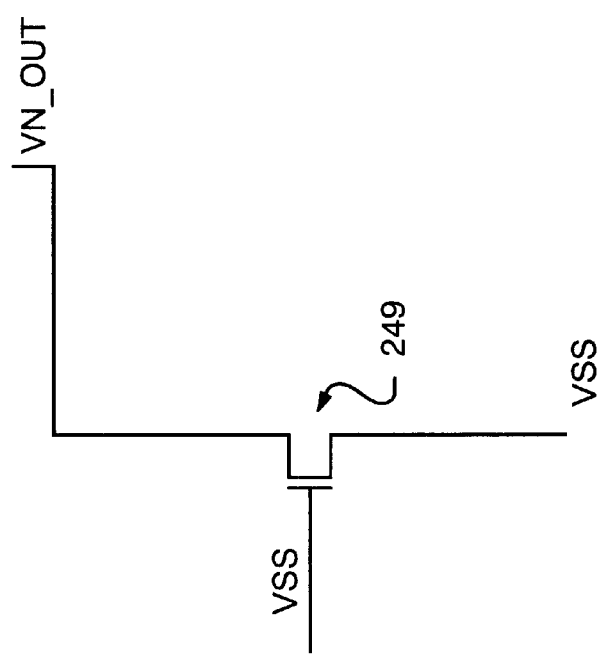

FIGS. 14 and 15 represent charges seen at the drain of devices which are off. Table 6 identifies the models for these structures.

TABLE 6

MINIMUM CHARGE AT DRAIN (ON OR TURNING ON)

| Device Number | Voltage at source | Voltage at gate | Model | Maximum error from SPICE data |
|---|---|---|---|---|
| NMOS DEVICE: | | | | |
| 249 | VSS | VSS | 0.100*w | 24.76% |
| PMOS DEVICE: | | | | |
| 250 | VDD | VDD | 0.136*w + 0.029 | 20.60% |

In each of tables 1–6, the maximum difference between the data generated by SPICE and the model values is identified. In most instances, the model is within 10%. Testing of the models of the present invention has found that the capacitances are significantly more accurate than other existing processes and that timing verification using the models is also more accurate. Having thus described one illustrative embodiment, changes, improvements and modifications will be readily apparent to those of skill in this al1t. Such improvements and modifications are considered part the present invention which is limited solely by the scope of the appending claims.

What is claimed is:

1. A timing verification system for verifying timing paths in a circuit design including a plurality of interconnected devices comprising:
   (A) charge determining means for determining a plurality of charges at a corresponding plurality of specific nodes within a circuit, each of the plurality of charges corresponding to a specific configuration of devices and including model generation means for generating a plurality of models corresponding to said plurality of nodes, each of said plurality of models representing defining a charge within a specific configuration based on characteristics of a device in said specific configuration, each said specific configuration including at least one MOS device having:
      (i) a gate connected to either one of a rising voltage input or a falling voltage input;
      (ii) a source and a drain at a voltage which is in an opposite direction to that to which the gate is connected; and
   (B) delay determining means for determining delays in paths in a selected circuit design to be verified using selected ones of said plurality of charges corresponding to one of the specific configurations representative of that circuit design.

2. The timing verification system of claim 1, wherein said means for generating models includes means for applying curve fitting techniques to said charges.

3. The timing verification system of claim 1, wherein such charge determining means includes
   charge calculation means for determining a charge for a node in said circuit design based upon one of said plurality of models corresponding to a configuration at said node and characteristics of a device on said node.

4. The timing verification system of claim 3, wherein said means for generating models includes means for determining at least two models corresponding to charges, a first model which exceeds each of the charges determined by simulation, and a second model which is less than each of the charges determined by simulation.

5. The timing verification system of claim 3, wherein said models correspond to at least one of a minimum charge at a gate of a device, a maximum charge at a gate of a device, a minimum charge at a drain of a device, and a maximum charge at a drain of a device.

6. The timing verification system of claim 3, wherein said model generation means includes means for simulating signals in said set of configurations for a plurality of characteristic values of said devices.

7. The timing verification system of claim 6, wherein said means for simulating signals simulates signals based upon predetermined operating conditions that include temperature.

8. The timing verification system of claim 7, wherein said predetermined operating conditions correspond to operating conditions of said circuit design.

9. A timing verification system for verifying timing paths in a circuit design including a plurality of interconnected devices comprising:
   (A) charge determining means for determining a plurality of charges at a corresponding plurality of specific nodes within a circuit, each of the plurality of charges corresponding to a specific configuration of devices and including model generation means for generating a plurality of models corresponding to said plurality of nodes, each of said plurality of models representing defining a charge within a specific configuration based on characteristics of a device in said specific configuration, each said specific configuration including at least one MOS device having:
      (i) a gate connected to either one of a rising voltage input or a falling voltage input;
      (ii) at least one of either a source or a drain connected to a Miller effect voltage; and
   (B) delay determining means for determining delays in paths in a selected circuit design to be verified using selected ones of said plurality of charges corresponding to one of the specific configurations representative of that circuit design.

10. The timing verification system as defined in claim 9, wherein the source is at the Miller effect voltage, and the drain is connected to either VSS or VDD.

11. The timing verification system as defined in claim 9, wherein the drain is at the Miller effect voltage, and the source is connected to either VSS or VDD.

12. The timing verification system of claim 9, wherein said charge determining means includes:

charge calculation means for determining a charge for a node in said circuit design based upon one of said plurality of models corresponding to a configuration at said node and characteristics of a device at said node.

13. The timing verification system of claim 12, wherein said model generation means includes:

means for creating a set of configurations of devices;

means for simulating signals in said set of configurations for a plurality of characteristic values of said devices;

means for determining charges at nodes in said set of configurations of devices based upon said signals; and means for generating models of charges based upon said charges and said plurality of characteristics of said devices.

14. The timing verification system of claim 13, wherein said means for simulating signals simulates signals based upon predetermined operating conditions that include temperature.

15. The timing verification system of claim 14, wherein said predetermined operating conditions correspond to operating conditions of said circuit design.

16. The timing verification system of claim 13, wherein said means for generating models includes means for applying curve fitting techniques to said charges.

17. The timing verification system of claim 13, wherein said means for generating models includes means for determining at least two models corresponding to charges, a first model which exceeds each of the charges determined by simulation, and a second model which is less than each of the charges determined by simulation.

18. The timing verification system of claim 12, wherein said models correspond to at least one of a minimum charge at a gate of a device, a maximum charge at a gate of a device, a minimum charge at a drain of a device, and a maximum charge at a drain of a device.

* * * * *